(12) United States Patent
Sweatt et al.

(10) Patent No.: US 6,642,995 B2
(45) Date of Patent: Nov. 4, 2003

(54) MASK-TO-WAFER ALIGNMENT SYSTEM

(75) Inventors: William C. Sweatt, Albuquerque, NM (US); Daniel A. Tichenor, Castro Valley, CA (US); Steven J. Haney, Tracy, CA (US)

(73) Assignee: EUV LLC, Santa Clara, CA (US)

( * ) Notice: Subject to any disclaimer, the term of this patent is extended or adjusted under 35 U.S.C. 154(b) by 0 days.

(21) Appl. No.: 09/986,006

(22) Filed: Nov. 7, 2001

(65) Prior Publication Data
US 2003/0086068 A1 May 8, 2003

(51) Int. Cl.$^7$ ............... G03B 27/72; G03B 27/42; G03B 27/52; G02B 27/14
(52) U.S. Cl. ............... 355/71; 355/53; 355/55; 359/636
(58) Field of Search ............... 355/53, 55, 71; 359/629, 630, 633, 636, 639

(56) References Cited

U.S. PATENT DOCUMENTS

| | | | |
|---|---|---|---|
| 706,297 A | * | 8/1902 | Bruyn ............... 356/71 |
| 3,668,406 A | * | 6/1972 | Reid et al. ............... 356/521 |
| 4,586,786 A | * | 5/1986 | Suzuki et al. ............... 359/636 |
| 4,782,368 A | * | 11/1988 | Ogawa et al. ............... 355/43 |
| 5,243,465 A | * | 9/1993 | Fein ............... 359/636 |
| 5,450,240 A | | 9/1995 | Hall, II et al. |
| 6,031,598 A | | 2/2000 | Tichenor et al. |
| 6,147,818 A | | 11/2000 | Hale et al. |

* cited by examiner

*Primary Examiner*—Rodney Fuller
(74) *Attorney, Agent, or Firm*—Fliesler Dubb Meyer and Lovejoy LLP

(57) ABSTRACT

A modified beam splitter that has a hole pattern that is symmetric in one axis and anti-symmetric in the other can be employed in a mask-to-wafer alignment device. The device is particularly suited for rough alignment using visible light. The modified beam splitter transmits and reflects light from a source of electromagnetic radiation and it includes a substrate that has a first surface facing the source of electromagnetic radiation and second surface that is reflective of said electromagnetic radiation. The substrate defines a hole pattern about a central line of the substrate. In operation, an input beam from a camera is directed toward the modified beam splitter and the light from the camera that passes through the holes illuminates the reticle on the wafer. The light beam from the camera also projects an image of a corresponding reticle pattern that is formed on the mask surface of the that is positioned downstream from the camera. Alignment can be accomplished by detecting the radiation that is reflected from the second surface of the modified beam splitter since the reflected radiation contains both the image of the pattern from the mask and a corresponding pattern on the wafer.

34 Claims, 2 Drawing Sheets

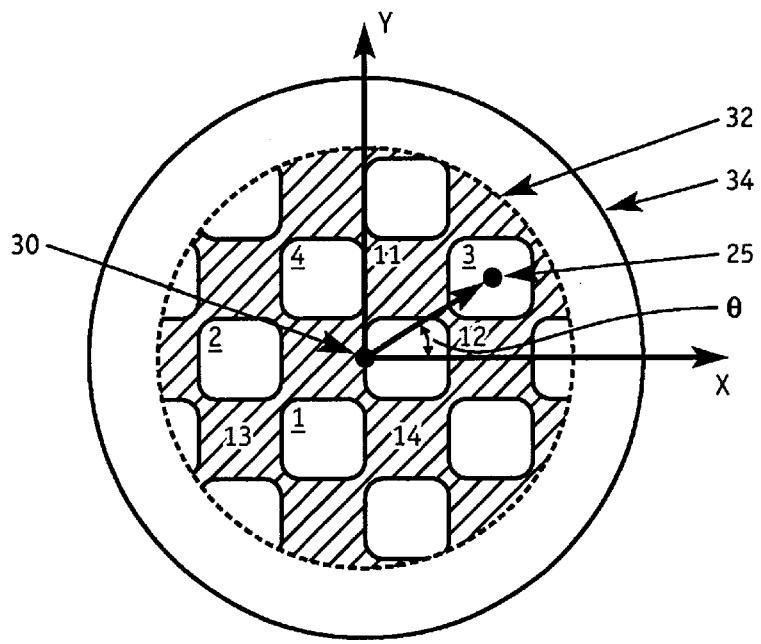
FIG. 2
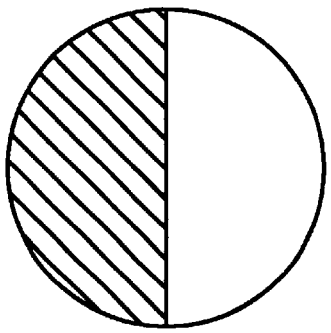
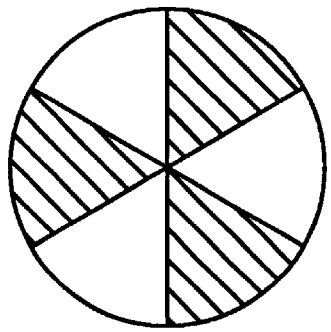
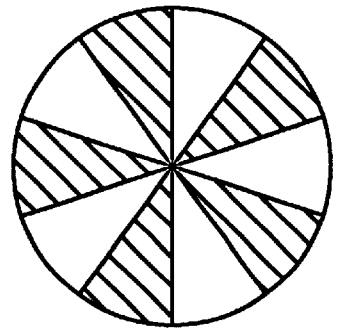
FIG. 3A   FIG. 3B   FIG. 3C

MASK-TO-WAFER ALIGNMENT SYSTEM

This invention was made with Government support under Contract No. DE-AC04-94AL85000 awarded by the U.S. Department of Energy to Sandia Corporation. The Government has certain rights to the invention.

FIELD OF THE INVENTION

This invention relates to an apparatus for alignment of a beam of light with respect to a wafer on which high resolution patterns are to be defined and more particularly to an apparatus including a beam splitter for through-the-lens, visible light alignment.

BACKGROUND OF THE INVENTION

In general, lithography refers to processes for pattern transfer between is various media. A lithographic coating is generally a radiation-sensitized coating suitable for receiving a projected image of the subject pattern. Once the image is projected, it is indelibly formed in the coating. The projected image may be either a negative or a positive of the subject pattern. Typically, a "transparency" of the subject pattern is made having areas which are selectively transparent, opaque, reflective, or non-reflective to the "projecting" radiation. Exposure of the coating through the transparency causes the image area to become selectively crosslinked and consequently either more or less soluble (depending on the coating) in a particular solvent developer. The more soluble (i.e., uncrosslinked) areas are removed in the developing process to leave the pattern image in the coating as less soluble crosslinked polymer.

Projection lithography is a powerful and essential tool for microelectronics processing and has supplanted proximity printing. "Long" or "soft" x-rays (a.k.a. Extreme UV) (wavelength range of $\lambda=100$ to 200 Å) are now at the forefront of research in efforts to achieve the smaller desired feature sizes. With projection photolithography, a reticle (or mask) is imaged through a reduction-projection lens onto a wafer. Reticles for EUV projection lithography typically comprise a silicon substrate coated with an x-ray reflective material and an optical pattern fabricated from an x-ray absorbing material that is formed on the reflective material. In operation, EUV radiation from the condenser is projected toward the surface of the reticle and radiation is reflected from those areas of the reticle reflective surface which are exposed, i.e., not covered by the x-ray absorbing material. The reflected radiation effectively transcribes the pattern from the reticle to the wafer positioned downstream from the reticle.

It is well known that direct writing of a resist-coated semiconductor wafer with a beam of radiation can be employed to define high-resolution features for, for example, a very-large-scale-integrated circuit. In practice, circuit features are successively defined in the resist in a series of exposure steps. Following each exposure step, standard developing and processing steps such as etching, deposition, diffusion, etc., are carried out to form a prescribed pattern in the wafer. In this way, patterns are formed at successive so-called levels in the overall fabrication sequence. It is apparent that the patterns formed at these respective levels must be accurately aligned or registered with respect to each other.

In UV and DUV optical lithography, it is known to form alignment marks on the mask and the wafer and to employ the marks for precisely registering the mask with respect to the wafer. In this way, the two are accurately located in preparation for a subsequent patterning operation. During the registration step, the alignment marks are scanned by the beam in both the X and Y directions. Electrons backscattered from the scanned marks are detected and utilized to generate electrical signals. In turn, these signals serve as the basis for precisely positioning the beam with respect to the wafer.

In current lithography tools the indirect method of mask-to wafer alignment is most commonly used. This approach requires three steps. In the first step a stage alignment reference (SAR), that is located on the stage, is used to sense an alignment mark imaged from the mask by the lithographic projection system. This step locates the stage relative to the aerial image of the mask. In the second step an alignment microscope, that is attached to the projection system, senses the SAR. This step locates the stage relative to the alignment microscope. In the final step one or more alignment marks on the wafer are detected by the alignment microscope. This step locates the alignment microscope relative to the wafer. Taken together these three steps locate the alignment marks on the wafer to the aerial image of the mask as desired. This three-step process is time consuming and there are errors associated with each step. The inventive beam splitter enables a single-step through-the-lens alignment process.

SUMMARY OF THE INVENTION

Lithography systems are telecentric at the wafer, so viewing the superimposed alignment marks of the mask and wafer in sharp detail is problematic. The inventive beam splitter allows these images to be relayed to a viewing system without perturbing the alignment.

In one embodiment, the invention is directed to a beam splitter for transmitting and reflecting electromagnetic radiation from a source of electromagnetic radiation that includes:

a substrate having a first surface facing the source of electromagnetic radiation and second surface that is reflective of said electromagnetic radiation, wherein the substrate defines an anti-symmetric hole pattern about a central line on the substrate and symmetric in the perpendicular direction, and wherein the pattern comprises at least one hole through the substrate with the aperture of the hole being located at a defined first distance from the central point and the pattern further comprises an area, which is located at the same first distance but on the opposite side of the central point from the aperture, that defines a reflective solid surface.

In another embodiment, the invention is directed to a device for mask-to-wafer alignment that includes:

a source of electromagnetic radiation;

a substrate having a first surface facing the source of electromagnetic radiation and second surface that is reflective of said electromagnetic radiation, wherein the substrate defines a hole pattern about a central point of the substrate, and wherein the pattern comprises at least one hole through the substrate with the aperture of the hole being located at a defined first distance from the central point and the pattern further comprises an area, which is located at the same first distance but on the opposite side of the central point from the aperture, that defines a reflective solid surface;

means for projecting electromagnetic radiation containing a roughly centered image of a mask pattern toward the first surface of the substrate;

a wafer having a wafer pattern on its surface wherein the wafer is positioned downstream from the substrate so that electromagnetic radiation that passes through the at one least hole of the substrate is reflected from the wafer to produce reflected electromagnetic radiation containing superimposed images of the mask pattern and of the wafer pattern toward the reflective second surface of the substrate; and following this reflection, means for detecting the superimposed images.

In a further embodiment, the invention is directed to a method for mask-to-wafer alignment that includes the steps of:

providing a mask that has a mask pattern on its surface;

providing a wafer that has a wafer pattern on its surface;

projecting electromagnetic radiation containing an image of the mask pattern through a beam splitter that comprises a substrate having a first surface and a reflective second surface whereby electromagnetic radiation that traverses through at least one hole that is formed through the substrate is reflected off the wafer surface to form a reflected electromagnetic radiation containing superimposed images of the mask pattern and of the wafer pattern that is directed toward the reflective second surface of the substrate; and detecting the superimposed images.

BRIEF DESCRIPTION OF THE DRAWINGS

FIG. 2 is the top view of the beam splitter viewed along beam centerline; and

FIGS. 3A, 3B, and 3C illustrate pie-shaped anti-symmetric hole patterns viewed along the centerline.

DETAILED DESCRIPTION OF THE INVENTION

Figure 1:
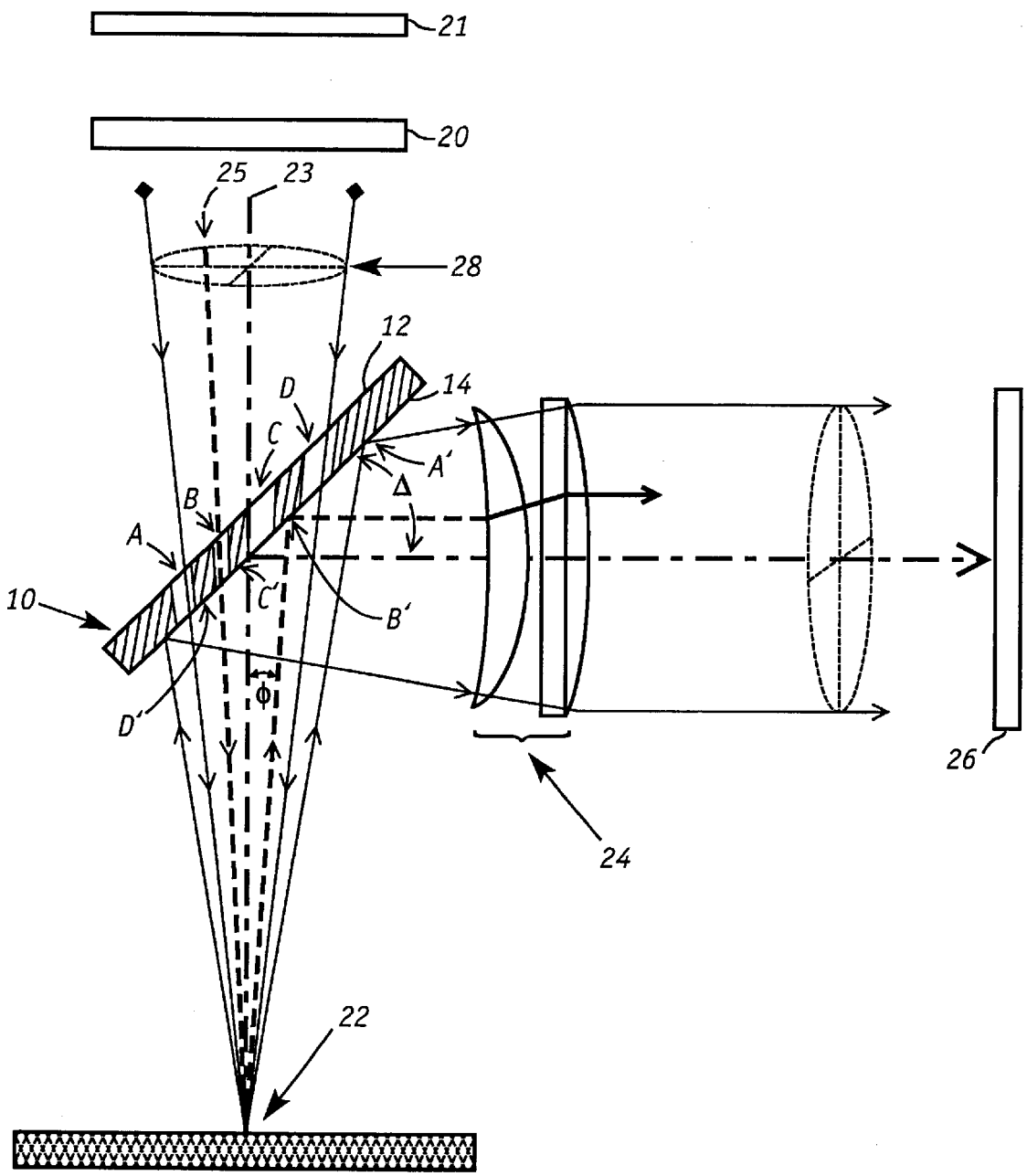
FIG. 1 is a cross sectional view of a through-the-lens alignment system.

The present invention is directed to an alignment system that employs a modified beam splitter. The system is particularly suited for through-the-lens rough alignment of the mask and wafer in a photolithography system using visible light that is projected through an EUV lithography camera. EUV lithography machines are described, for example, in Tichenor, et al., U.S. Pat. No. 6,031,598 and Hale et al., U.S. Pat. No. 6,147,818, which are incorporated herein by reference. As shown in FIG. 1, the system includes beam splitter 10 that has a plurality of through-holes A, B, C, and D that are cut through the diagonal of the beam splitter substrate, which has upper surface 12 and lower reflective surface 14. Upper surface 12 need not be reflective of the radiation. The phrase "diagonal of the beam splitter substrate" means that the holes are formed essentially straight through the substrate when the substrate is tilted at an angle Δ that ranges from about 30° to 60°. Preferably each hole has a longitudinal axis that is aligned with the average propagation direction of light used for alignment. Preferrably, each hole of the beam splitter defines an area that ranges from 10 mm² to 2500 mm² and the substrate preferably has a thickness that ranges from 1 mm to 10 mm.

The beam splitter 10 is positioned between a camera 20 and a wafer 22 that has a reticle comprising a set of lines, dots, or other pattern (collectively also referred to as "alignment marks") on the wafer surface. In operation, input beam 28 from the camera 20 is directed toward the beam splitter 10 and the light from the camera that passes through the holes A, B, C, D illuminates the reticle on the wafer 22. The light beam from the camera projects an image of a corresponding mask pattern (or mask alignment marks) that is formed on the surface of mask 21 that is positioned downstream from the camera 20. An important aspect of the invention is that the beam splitter is preferably designed to maximize the optical intensity of the mask and wafer images and to also maximize the transmission of spatial information defining the mask and wafer images. In other words, the beam splitter maximizes the brightness and the sharpness of the patterns on both the mask and wafer. To maximize the light level and the spatial signal through-put, the hole pattern needs to be anti-symmetric to one axis. This allows light that passes through a hole to reflect off the mirror on the opposite side of the beam splitter's centerline. As an illustration, the hole pattern in beam splitter 10 is anti-symmetric with respect to the centerline as holes A and B on the left of centerline 23 have corresponding solid areas A' and B' on the right side lower surface, similarly, holes C and D on the right side have corresponding solid areas C' and D'.

A variety of detectors can be employed to detect the reflected radiation including, for example, array video cameras and charge-coupled devices. Since the reflected radiation contains images of the patterns on the mask and wafer, analysis of the detected radiation facilitates alignment of the mask or wafer. In practice, the mask, wafer or both are adjusted (e.g., moved) until the two patterns register within the desired tolerance levels.

To the first order, light containing the image of the mask reticle simply reflects off the surface of wafer 22, which functions as a flat mirror with line patterns on it. As an illustration, in FIG. 1 a ray of light 25 from the source passes through hole B in beam splitter 10, reflects first off the wafer 22 and then off the beam splitter at position B' and passes on to viewing system 26. This ray is defined by azimuth angle θ shown in FIG. 2 and elevation angle φ shown in FIG. 1. (As is apparent, the hole pattern in FIG. 2 is illustrative does not correspond exactly with that of FIG. 1.) A ray of radiation from the mask that arrives at a compound angle of (θ, φ)) will reflect off the surface at the opposite side of the axis, that is, at an angle of (θ+π, φ). Hence, for any angle (θ, φ) where the beam splitter transmits light, the point on the opposite side of the axis, (θ+π, φ) should reflect light.

A preferred anti-symmetric hole pattern for the beam splitter is shown in FIG. 2. Each area on the beam splitter that has a hole through the substrate has a corresponding area on the diametrically opposite position of the substrate that is solid and reflective. For example, holes 1, 2, 3, and 4 have corresponding solid areas 11, 12, 13, and 14 on the opposite side. This anti-symmetric hole pattern is formed about a central point 30 on the substrate which also serves as the optical centerline of the alignment system. In this preferred embodiment, the holes are square-shaped and each have rounded corners so they can be cut with a radiused tool. Preferably, anti-symmetric hole pattern is designed so that about 50% of the light from the camera passes through the holes. When the holes are judiciously designed, enough information from the two alignment patterns can be presented to the viewing system to allow good alignment. Note that the visible light illumination should be incoherent or structured so all of the holes in the beam splitter will be illuminated.

The amount of surface on the beam splitter surface containing the anti-symmetric hole pattern that is useful will be governed by the numerical aperture (n.a.) of the camera employed. As shown, in FIG. 2, in the case of a camera with an n.a. of 0.10, the useful area on the beam splitter is defined by perimeter 32. The collection optics 24 would be faster if a camera having a larger n.a. is used. For example, perimeter 34 defines the useful area on the beam splitter surface with a camera having an n.a. of 0.13. The hole pattern should preferably remain inside the camera's n.a. as much as is reasonable to maximize the signal from the wafer reticle.

As illustrated by the configuration shown in FIG. 2, the hole pattern on the beam splitter must have antisymmetry about the center of the pattern. Thus, if on the lower mirror surface an area designated (x, y) reflects light, then the hole pattern has a hole at a location on the lower mirror surface designated (−x, y) or (x, −y). It is not necessary to have symmetry about the axis that is perpendicular to the beam splitter but it is preferred since the alignment system will pass diffracted information more symmetrically.

As is apparent, the configurations of the holes can vary. They can have regular and irregular shapes, i.e., perimeters. For examples, holes can be circular or have a regular polygonal-shaped. Holes with irregular polygon contours can be used but are more difficult of manufacture.

FIGS. 3A, 3B, and 3C illustrates circular pie-shaped configurations of anti-symmetric hole patterns in which the holes and the corresponding solid reflective areas are represented as pie slices. In FIG. 3A, substrate 50 has a pattern that contains a hole on one side and a solid reflective area on the other side of the pattern. FIGS. 3B and 3C illustrates a pie with 3 and 5 holes, respectively. Preferred beam splitters of the present invention have hole patterns with 3 or more holes. As is apparent, for pie-shaped anti-symmetric hole patterns, the total number of holes and solid reflective areas together is represented by the equation 4N−2, where N is a positive integer. From a practical standpoint, N typically will range from 1 and 6 and preferably from 2 to 4. The middle of each pie can correspond to the optical centerline. The slices are shown to be equal in area but it is understood that equality is not required.

The beam splitter can be manufactured from a substrate such as a standard front-surface mirror. The specific array of holes are then cut through on the diagonal as shown in beam splitter 10 in the FIG. 1. The hole patterns are typically designed so that the beam splitter allows about 40% to 60% and preferably from 45% to 55% of the light from the camera to pass through the holes. Though not critical, the thickness of the substrate will typically range from about 1 to 10 mm. Suitable materials for the beam splitter include, for example, a low expansion materials such as ceramic. A preferred material is glass ceramic that is commercially available as ZERODUR from Schott Jenaaer Gals, GmbH, Mainz, Germany. The lower surface mirror of the beam splitter which is formed by polishing the ceramic should provide a nearly diffraction-limited wavefront quality reflecting surface.

The beam splitter should be sufficiently rigid so that the lower surface from which light is reflected remains flat to allow diffraction-limited imaging of the reflected beam from the wafer over time and temperature excursions. In addition, the shape, location, and number of holes in the anti-symmetric hole pattern should be designed to maximize the image sharpness of the alignment marks from both the mask and wafer. Furthermore, the brightness of both images should be maximized. This can be achieved by designing the anti-symmetric hole pattern so that the areas occupied by the holes is about 50% of the area of the hole pattern. Referring to the beam splitter of FIG. 2, this is achieved by designing the pattern so that holes occupy about 50% of the area within perimeter 32.

The inventive beam splitters with the anti-symmetric hole pattern are superior to conventional beam splitters for alignment purposes. For example, beam splitters having a glass window with a partially silvered surface can be made with very flat surfaces so the image quality relayed to the viewing system can be nearly perfect. Unfortunately a tilted glass substrate will translate the image from the mask sideways and defocus it. Clearly this is unacceptable. A pellicle beam splitter, which consists of an extremely thin transparent membrane with a silver coating is also not suitable. The defocus and sideways off-set of the mask image are tolerable with a pellicle, but a large membrane, e.g., 2–3 cm diameter, is not rigid enough to stay flat on its own. Specifically, a large pellicle membrane will not remain flat to allow diffraction-limited imaging of a reflected beam over an extending period of time especially as operating conditions change, e.g., temperature fluctuations. And mounting the pellicle membrane so that it will remain flat to far less than a wavelength, e.g., $\lambda/10$, is extremely difficult.

Although only preferred embodiments of the invention are specifically disclosed and described above, it will be appreciated that many modifications and variations of the present invention are possible in light of the above teachings and within the purview of the appended claims without departing from the spirit and intended scope of the invention.

What is claimed is:

1. A beam splitter for transmitting and reflecting electromagnetic radiation from a source of electromagnetic radiation that comprises:
   a substrate having a first surface facing the source of electromagnetic radiation and second surface that is reflective of said electromagnetic radiation, wherein the substrate includes a number of apertures with at least a majority of the apertures defining an anti-symmetric hole pattern about a central line on the substrate and symmetric in the perpendicular direction, and wherein the pattern defines a plurality of holes about the central line of the substrate such that each hole with its corresponding aperture through to the second surface of the substrate at a defined distance from the central point has a corresponding area located the same distance on the other side of the central point that defines a reflective solid surface.

2. The beam splitter of claim 1 wherein each hole has a longitudinal axis that is aligned with an average propagation direction of the electromagnetic radiation.

3. The beam splitter of claim 1 wherein each hole has a substantially square cross section with rounded corners.

4. The beam splitter of claim 1 wherein the pattern has a pie-shaped perimeter and the total number of holes plus the corresponding reflective solid surfaces are equal to 4N−2, wherein N is a positive integer.

5. The beam splitter of claim 4 wherein each hole has a pie-slice configuration and each reflective solid surface has pie-slice configuration.

6. The beam splitter of claim 1 wherein the substrate is made of a ceramic material.

7. The beam splitter of claim 1 wherein the pattern has at least 3 holes.

8. The beam splitter of claim 1 wherein each of the at least one hole defines an area that ranges from 10 mm$^2$ to 2500 mm$^2$ and the substrate has a thickness that ranges from 1 mm to 10 mm.

9. The beam splitter of claim 1 wherein the electromagnetic radiation used for alignment is visible light.

10. The beam splitter of claim 1 wherein all of the apertures of the substrate are antisymmetric about the central line on the substrate and are symmetric in the perpendicular direction.

11. A device for mask-to-wafer alignment that comprises:
   a source of electromagnetic radiation for alignment;
   optics means for delivering radiation from the source of radiation to a reflective mask;
   a camera to image an alignment pattern on the reflective mask through a beam splitter to a wafer plane wherein the beam splitter comprises a substrate having a first surface facing the camera and a second surface that is reflective of said electromagnetic radiation, wherein the substrate includes a number of apertures with at least a majority of the apertures defining a hole pattern about a central point of the substrate, and wherein the pattern defines a plurality of holes that defines a hole pattern about the central point of the substrate such that each hole with its corresponding aperture through to the second surface of the substrate at a defined distance from the central point has a corresponding area located the same distance on the other side of the central point that defines a reflective solid surface;

means for projecting electromagnetic radiation containing a roughly centered image of the mask alignment pattern toward the first surface of the substrate;

a wafer having a complementary alignment pattern on its surface wherein the wafer is positioned downstream from the beam splitter substrate so that electromagnetic radiation that passes through the at least one hole of the substrate is reflected from the wafer to produce reflected electromagnetic radiation containing superimposed images of the mask pattern and of the wafer pattern toward the reflective second surface of the substrate; and means for detecting the superimposed images reflected from the second surface.

12. The device of claim 11 wherein the means for projecting electromagnetic radiation comprises a camera.

13. The device of claim 12 wherein the means for detecting the superimposed images comprises an imaging lens system that focuses electromagnetic radiation containing the superimposed images wherein the camera has a numerical aperture that is less than that of the imaging lens system.

14. The device of claim 11 wherein the means for detecting the superimposed images comprises an array video camera or charge-coupled device.

15. The device of claim 11 wherein the electromagnetic radiation is visible light.

16. The device of claim 11 wherein each hole has a longitudinal axis that is aligned with an average propagation direction of the electromagnetic radiation.

17. The device of claim 11 wherein each hole has a square-like cross section with rounded corners.

18. The device of claim 11 wherein the antisymmetric hole pattern has a pie-shaped perimeter and the total number of holes plus the corresponding reflective solid surfaces are equal to 4N−2, wherein N is a positive integer.

19. The device of claim 18 wherein each hole has a pie-slice configuration and each reflective solid surface has pie-slice configuration.

20. The device of claim 11 wherein the substrate is made of a ceramic material.

21. The device of claim 11 wherein the pattern has at least 3 holes.

22. The device of claim 11 wherein each of the at least one hole defines an area that ranges from 10 mm$^2$ to 2500 mm$^2$ and the substrate has a thickness that ranges from 1 mm to 10 mm.

23. The device of claim 11 wherein all of the apertures of the substrate are antisymmetric about the central line on the substrate and are symmetric in the perpendicular direction.

24. A method for mask-to-wafer alignment that comprises the steps of:

providing a mask that has an alignment pattern on its surface;

providing a wafer that has a complementary alignment pattern on its surface;

providing a source of electromagnetic radiation and delivering radiation from the source to the mask;

providing a camera that images the alignment pattern on the mask through the beam splitter and onto the wafer;

providing a beam splitter that comprises a substrate having a first surface facing the source of electromagnetic radiation and second surface that is reflective of said electromagnetic radiation, wherein the substrate includes a number of apertures with at least a majority of the apertures defining a hole pattern about a central point of the substrate, and wherein the pattern defines a plurality of holes that defines a hole pattern about the central point of the substrate such that each hole with its corresponding aperture in the second surface of the substrate at a defined distance from the central point has a corresponding area located the same distance on the other side of the central point that defines a reflective solid surface;

projecting electromagnetic radiation from the source of electromagnetic radiation containing an image of the mask pattern through the beam splitter whereby electromagnetic radiation that traverses through at least one hole that is formed through the substrate is reflected off the wafer surface to form a reflected electromagnetic radiation containing superimposed images of the mask alignment pattern and of the complementary wafer alignment pattern that is directed toward the reflective second surface of the substrate;

reflecting a combined signal off the second surface of the beam splitter; and detecting the superimposed images.

25. The method of claim 24 wherein each hole has longitudinal axis that is aligned with an average propagation direction of the electromagnetic radiation.

26. The method of claim 24 wherein the substrate defines a plurality of holes that defines a hole pattern about the central point of the substrate such that each hole with its corresponding aperture in the second surface of the substrate at a defined distance from the central point has a corresponding area located the same distance on the other side of the central point that defines a reflective solid surface.

27. The method of claim 24 wherein each hole has a substantially square cross-section with rounded corners.

28. The method of claim 24 wherein the antisymmetric hole pattern has a pie-shaped perimeter and the total number of holes plus the corresponding reflective solid surfaces are equal to 4N−2, wherein N is a positive integer.

29. The method of claim 24 wherein each hole has a pie-slice configuration and each reflective solid surface has pie-slice configuration.

30. The method of claim 24 wherein the substrate is made of ceramic material.

31. The method of claim 24 wherein the hole pattern has at least 3 holes.

32. The method of claim 24 wherein each of the at least one hole defines an area that ranges from 10 mm$^2$ to 2500 mm$^2$ and the substrate has a thickness that ranges from 1 mm to 10 mm.

33. The method of claim 24 wherein the electromagnetic radiation is visible light.

34. The method of claim 24 wherein all of the apertures of the substrate are antisymmetric about the central line on the substrate and are symmetric in the perpendicular direction.

* * * * *